(12) United States Patent
Penzes

(10) Patent No.: US 7,957,172 B2
(45) Date of Patent: Jun. 7, 2011

(54) SYSTEM FOR RETAINING STATE DATA OF AN INTEGRATED CIRCUIT

(75) Inventor: Paul Penzes, Newport Beach, CA (US)

(73) Assignee: Broadcom Corporation, Irvine, CA (US)

( * ) Notice: Subject to any disclaimer, the term of this patent is extended or adjusted under 35 U.S.C. 154(b) by 806 days.

(21) Appl. No.: 11/821,437

(22) Filed: Jun. 22, 2007

(65) Prior Publication Data

US 2008/0316850 A1    Dec. 25, 2008

(51) Int. Cl.
*G11C 15/00*    (2006.01)

(52) U.S. Cl. .................... 365/49.11; 365/49.16; 365/226

(58) Field of Classification Search .................. 365/226, 365/49.11, 154, 205, 49.16

See application file for complete search history.

(56) References Cited

U.S. PATENT DOCUMENTS

| | | | | | |
|---|---|---|---|---|---|
| 5,787,273 | A | * | 7/1998 | Runaldue | 713/500 |
| 6,973,101 | B1 | * | 12/2005 | Grivna | 370/510 |
| 7,372,928 | B1 | * | 5/2008 | Foley et al. | 375/354 |
| 2002/0087928 | A1 | * | 7/2002 | Six | 714/726 |

FOREIGN PATENT DOCUMENTS

JP    2005148837 A  *  6/2005

* cited by examiner

*Primary Examiner* — Richard Elms
*Assistant Examiner* — Hien N Nguyen
(74) *Attorney, Agent, or Firm* — Farjami & Farjami LLP

(57) ABSTRACT

According to one embodiment, a system for retaining M bits of state data of an integrated circuit during power down includes M serially coupled scan flip flops divided into M/N groups, where the M scan flip flops are able to save/restore the M bits of state data. Each group contains a merged scan flip flop coupled to a series of scan flip flops. The merged scan flip flop in each of the groups is coupled to a respective read port of a memory unit, and a final scan flip flop in each of the groups is coupled to a respective write port of the memory unit. The system enables the memory unit to save the M bits of state data in N clock cycles. Each merged scan flip flop has a read select input that enables restoring of the state data into the M scan flip flops in N clock cycles.

16 Claims, 3 Drawing Sheets

SYSTEM FOR RETAINING STATE DATA OF AN INTEGRATED CIRCUIT

BACKGROUND OF THE INVENTION

1. Field of the Invention

The present invention is generally in the field of electronics. More particularly, the present invention is in the field of electronic circuit and logic design.

2. Background

Even when an integrated circuit is powered down, i.e. in a "standby mode," the circuit can consume considerable amount of power, generally known as "leakage power." For example, an integrated circuit situated in a portable electronic device, such as a cell phone, can rapidly deplete a power source, such as a battery, of the portable electronic device, even during periods when the portable electronic device is in a standby mode. Such power dissipation can be substantially reduced or eliminated by powering down the entire integrated circuit during periods when the integrated circuit is in the standby mode. However, the state of the integrated circuit, i.e. the state data contained in various circuits, registers, flip flops, and memory devices, must be retained prior to powering down the integrated circuit and thereafter restored to the integrated circuit during power up.

One conventional approach for retaining the state of an integrated circuit involves the use of "balloon flip flops," where each flip flop includes a "shadow latch" (or a "shadow flip flop") powered by an independent power supply route. Before entering into the standby mode, the state of each flip flop is passed to its shadow latch, while upon entering the active mode (i.e. "power up" mode), the shadow latch writes back the saved value into the flip flop. When entering the standby mode (i.e. the "power down" mode), the supply to the flip flops and to all other circuits can be turned off, while only the supply to the "shadow flip flops" has to be on.

This approach has the advantage that most of the leakage power is reduced or eliminated and the state of the integrated circuit can be quickly interchanged (saved/restored) with that of the shadow latches. However, there are significant implementation complications with this approach, complications that are not easy to overcome. One problem is that the balloon flip flops need two overlapping but independent power supplies, with the associated power routing, one supply to be routed to each flip flop (which will be powered down during standby), and a second supply to be routed to the shadow flip flop (which will remain powered during standby). A second overlapping power supply would have a significant negative impact on the design flow, starting from standard cell libraries, through synthesis and all the way to chip verification. Also, extra routing overhead is required for the signals used to control the save/restore mechanism associated with each flip flop and its shadow. Moreover, the area increase in the "balloon flip flop" approach is significant.

SUMMARY OF THE INVENTION

A system for retaining state data of an integrated circuit, substantially as shown in and/or described in connection with at least one of the figures, as set forth more completely in the claims.

DETAILED DESCRIPTION OF THE INVENTION

The present invention is directed to a system for retaining state data of an integrated circuit. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
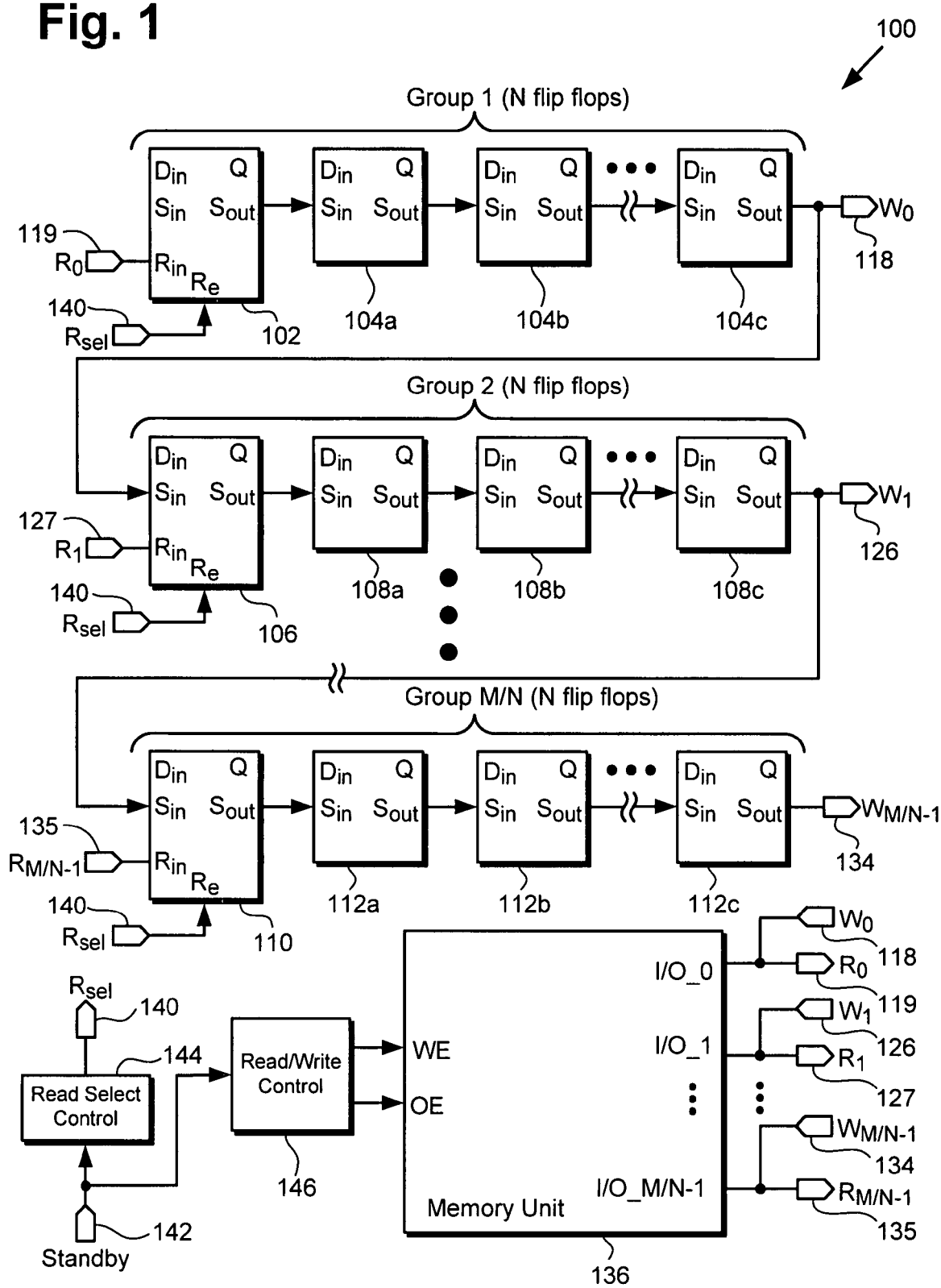
FIG. 1 shows a block diagram of a system for retaining state data of an integrated circuit in accordance with one embodiment of the invention.

FIG. 1 shows a block diagram of system 100 for retaining state data of an integrated circuit during power down in accordance with one embodiment of the invention. System 100 includes M scan flip flops (e.g., scan flip flops 102, 104a, 104b, 104c, 106, 108a, 108b, 108c), memory unit 136, read select control circuit 144, and read/write control circuit 146. As shown in FIG. 1, the M scan flip flops are divided into M/N groups, such that each group includes N scan flip flops. In the embodiment of FIG. 1, each group includes four scan flip flops (i.e., N=4), where scan flip flops 102, 104a, 104b, and 104c form group 1, scan flip flops 106, 108a, 108b, and 108c form group 2, and scan flip flops 110, 112a, 112b, and 112c form group M/N.

The M scan flip flops in system 100 can be used to, at least temporarily, hold the state of various circuits and registers in an integrated circuit. The integrated circuit can be, for example, a central processing unit ("CPU") or a microcontroller. In one embodiment, the integrated circuit and memory unit 136 can be situated in a portable electronic device, such as a cellular telephone, a personal digital assistant ("PDA"), a laptop computer, an MP3 player, or a digital camera. In one embodiment, the integrated circuit, including the M scan flip flops, is powered by a first power supply line and memory unit 136 is powered by an independent second power supply line. In such an embodiment, the first and second power supplies are derived from a power source, such as a battery, of the portable electronic device.

As shown in FIG. 1, the initial scan flip flop in each group (also referred to as a "merged" scan flip flop), such as merged scan flip flop 102, includes a data input ("$D_{in}$"), a scan input ("$S_{in}$"), a read input ("$R_{in}$"), a data output ("Q"), and a scan output ("$S_{out}$"). In one embodiment, and as discussed further below, the inputs of each merged scan flip flop, i.e., $D_{in}$, $S_{in}$, and $R_{in}$, are multiplexed such that only one input is selected at a given time. In one embodiment, when $D_{in}$ of a merged scan flip flop is selected, data provided to $D_{in}$ is output at Q after one clock cycle. Likewise, when either $S_{in}$ or $R_{in}$ is selected, data provided to either $S_{in}$ or $R_{in}$, is output at $S_{out}$ after one clock cycle.

As also shown in FIG. 1, each subsequent scan flip flop in each group, such as scan flip flops 104a, 104b, and 104c of group 1, includes a data input ("$D_{in}$"), a scan input ("$S_{in}$"), a data output ("Q"), and a scan output ("$S_{out}$"). In one embodiment, and as discussed further below, the inputs of each scan flip flop, i.e., $D_{in}$ and $S_{in}$, are multiplexed such that only one input is selected at a given time. In one embodiment, when $D_{in}$ of a scan flip flop is selected, data provided to $D_{in}$ is output at Q after one clock cycle. Likewise, when $S_{in}$ is selected, data provided to $S_{in}$ is output at $S_{out}$ after one clock cycle.

As further shown in FIG. 1, the M scan flip flops in system 100 are all "serially coupled," such that $S_{out}$ of each scan flip flop is coupled to $S_{in}$ of a subsequent scan flip flop. More specifically, as shown in FIG. 1, $S_{out}$ of merged scan flip flop 102 is coupled to $S_{in}$ of scan flip flop 104a, $S_{out}$ of scan flip flop 104a is coupled to $S_{in}$ of scan flip flop 104b, and so on. In one embodiment, the M scan flip flops in system 100 are configured to receive the same clock signal (not shown in FIG. 1). Thus, system 100 is configured such that data contained in the M scan flip flops can be serially shifted from one scan flip flop to a subsequent scan flip flop after one clock cycle.

As shown in FIG. 1, $S_{out}$ of each final scan flip flop in each group provides input to (i.e. is "coupled to") a respective write port of memory unit 136. More specifically, $S_{out}$ of final scan flip flop 104c in group 1 provides input to write port 118 ("$W_0$"), $S_{out}$ of final scan flip flop 108c in group 2 provides input to write port 126 ("$W_1$"), and $S_{out}$ of final scan flip flop 112c in group M/N provides input to write port 134 ("$W_{M/N-1}$"). In the embodiment of FIG. 1, each write port is coupled to a respective input/output ("I/O") port of memory unit 136. Memory unit 136 can be, for example, a static random access memory ("SRAM") device having M/N I/O ports (i.e., "I/O_0" through "I/O_M/N−1" shown in FIG. 1), where $W_0$ is coupled to I/O_0, $W_1$ is coupled to I/O_1, and $W_{M/N-1}$ is coupled to I/O_M/N−1.

As shown in FIG. 1, $R_{in}$ of each merged scan flip flop receives input from (i.e. is "coupled to") a respective read port of memory unit 136. More specifically, $R_{in}$ of merged scan flip flop 102 receives input from read port 119 ("$R_0$"), $R_{in}$ of merged scan flip flop 106 receives input from read port 127 ("$R_1$"), and $R_{in}$ of merged scan flip flop 110 receives input from read port 135 ("$R_{M/N-1}$"). In the embodiment of FIG. 1, each read port of memory unit 136 is coupled to a respective I/O port of memory unit 136, where $R_0$ is coupled to I/O_0, $R_1$ is coupled to I/O_1, and $R_{M/N-1}$ is coupled to I/O_M/N−1. As also shown in FIG. 1, read select signal ("$R_{sel}$") 140 is provided to the read select input ("$R_e$") of each merged scan flip flop in system 100. In one embodiment, $R_{sel}$ 140 can be a logic signal that can be used to select either $R_{in}$ or $S_{in}$ of each merged scan flip flop.

Each of the M scan flip flops in system 100 can contain one bit of state data of an integrated circuit. Accordingly, the M scan flip flops can collectively contain M bits of state data representing the state of the integrated circuit at any given time. As discussed below, the present invention advantageously enables memory unit 136 to store the M bits of state data contained in the M scan flip flops, thus allowing the state of the integrated circuit to be retained after the integrated circuit is powered down.

An exemplary write operation of system 100 for storing M bits of state data will now be discussed with reference to FIG. 1. As shown in FIG. 1, memory unit 136 is configured to concurrently receive each bit of state data output by final scan flip flops 104c, 108c, and 112c via respective write ports $W_0$ through $W_{(M/N)-1}$. Accordingly, since system 100 includes M/N groups of scan flip flops, and since each group includes one final scan flip flop, M/N bits of state data can be received by memory unit 136 in parallel in each clock cycle. Accordingly, in one embodiment, memory unit 136 can be configured to store the M/N bits of state data output by final scan flip flops 104c, 108c, and 112c as a first M/N bit word.

After memory unit 136 has stored the M/N bits of state data output by final scan flip flops 104c, 108c, and 112c, the M scan flip flops in system 100 can be clocked to shift each bit of state data contained in each scan flip flop to a subsequent scan flip flop in a serial manner. For example, the bit of state data contained in scan flip flop 104b can be shifted into final scan flip flop 104c, the bit of state data contained in scan flip flop 108b can be shifted into final scan flip flop 108c, and the bit of state data contained in scan flip flop 112b can be shifted into final scan flip flop 112c. Thereafter, memory unit 136 can be configured to store the M/N shifted bits of state data output by final scan flip flops 104c, 108c, and 112c as a second M/N bit word. Thus, by repeating such a sequence for N clock cycles, where N is the number of scan flip flops in each group of scan flip flops, the M bits of state data in system 100 can be stored in memory unit 136 as N M/N bit words, thus saving the state of the integrated circuit just prior to entering the standby mode. Once memory unit 136 has saved the M bits of state data contained in the M scan flip flops, system 100 can, upon power up, enable memory unit 136 to restore the M bits of state data to the respective M scan flip flops so as to recover the state of the integrated circuit.

An exemplary read operation of system 100 for restoring M bits of state data saved in memory unit 136 will now be discussed with reference to FIG. 1. As shown in FIG. 1, memory unit 136 can be configured to output an M/N bit word via respective read ports $R_0$ through $R_{M/N-1}$. In one embodiment, $R_{in}$ of each merged scan flip flop (i.e., merged scan flip flops 102, 106, and 110) in each group can be selected by setting $R_{sel}$ 140 to a logic "1," thereby allowing each merged scan flip flop to receive a respective bit of each M/N bit word output by memory unit 136. In one embodiment, memory unit 136 can be configured to output the first M/N bit word described above. Thereafter, the M scan flip flops in system 100 can be clocked to store each respective bit of the first M/N bit word. Memory unit 136 can then output the second M/N bit word described above. Thereafter, the M scan flip flops in system 100 can be clocked to shift out the stored bit in each merged scan flip flop to a subsequent scan flip flop, and to shift in a respective bit of the second M/N bit word. Thus, by repeating such a sequence for N clock cycles, where N is the number of scan flip flops in each group of scan flip flops, the M bits of state data in the integrated circuit can be fully restored to the corresponding M scan flip flops.

Thus, it can be appreciated that by reducing the number of scan flip flops in each group (i.e., by reducing N) and by consequently increasing the number of groups of scan flip flops, the invention can allow the M bits of state data to be stored in memory unit 136 in fewer clock cycles. Similarly, the M bits of state data can also be restored from memory unit 136 in fewer clock cycles.

In one embodiment, system 100 is controlled by a standby signal, such as standby 142. Standby 142 can be a logic signal which can toggle between a logic "1" and a logic "0." As shown in FIG. 1, standby 142 is provided to read select control circuit 144 and read/write control circuit 146. In one embodiment, when standby 142 is toggled to a logic 1, the M bits of state data can be stored in memory unit 136 by causing read select control circuit 144 to set $R_{sel}$ 140 to a logic 0 (i.e. by "disabling" $R_{sel}$ 140) for N clock cycles, thereby disabling $R_{in}$ of merged scan flip flops 102, 106, and 110. In addition, standby 142 can cause read/write control circuit 146 to provide appropriate write enable ("WE") and output enable ("OE") signals to memory unit 136 for performing N write operations.

However, when standby 142 is toggled to a logic 0, the M bits of state data saved in memory unit 136 can be restored to the M scan flip flops by causing read select control circuit 144 to set $R_{sel}$ 140 to a logic 1 (i.e. by "enabling" $R_{sel}$ 140) for N clock cycles, and by causing read/write control circuit 146 to provide appropriate WE and OE signals to memory unit 136 for performing N read operations.

Figure 2:
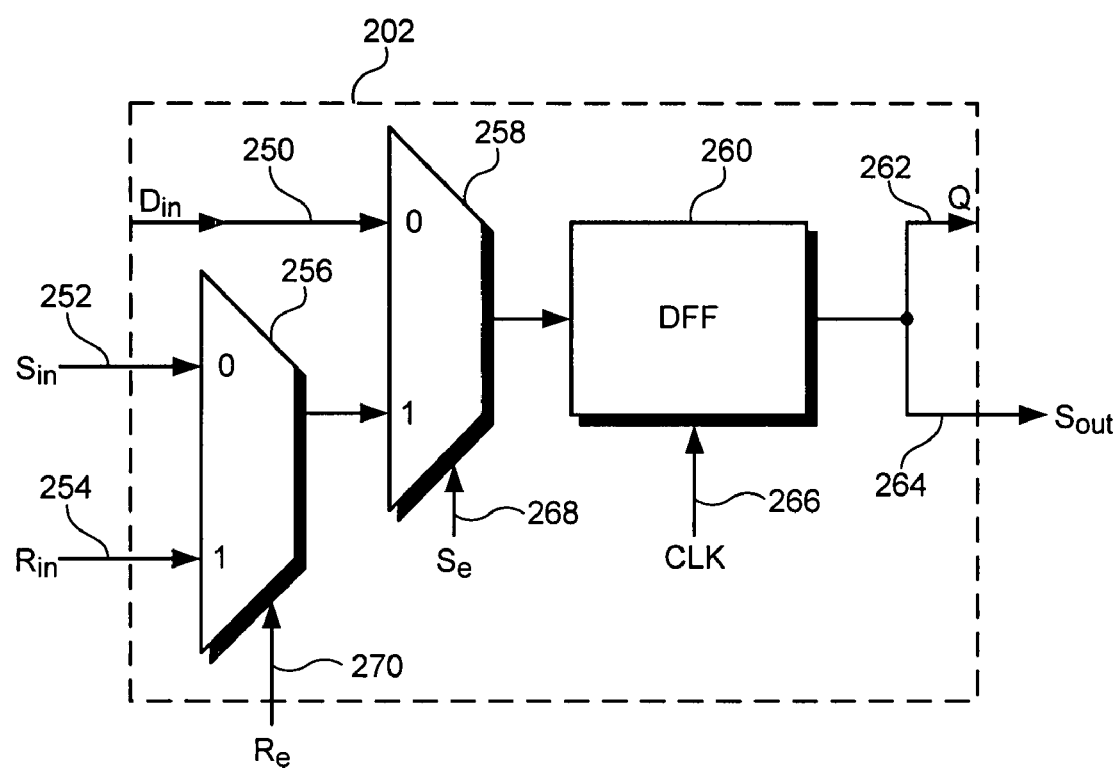
FIG. 2 shows an exemplary implementation of a merged scan flip flop used in the block diagram of FIG. 1 in accordance with one embodiment of the invention.

FIG. 2 shows an exemplary implementation of a merged scan flip flop in accordance with one embodiment of the invention. Merged scan flip flop 202 in FIG. 2 includes two-to-one multiplexers 256 and 258, and D flip flop ("DFF") 260. As shown in FIG. 2, merged scan flip flop 202 includes data input ("$D_{in}$") 250, scan input ("$S_{in}$") 252, read input ("$R_{in}$") 254, read select input ("$R_e$") 270, scan select input ("$S_e$") 268, clock input ("CLK") 266, data output ("Q") 262, and scan output ("$S_{out}$") 264. In one embodiment, $D_{in}$ 250, $S_{in}$ 252, $R_{in}$ 254, $R_e$ 270, Q 262, and $S_{out}$ 264 in FIG. 2 correspond respectively to $D_{in}$, $S_{in}$, $R_{in}$, $R_e$, Q, and $S_{out}$ of each merged scan flip flop in FIG. 1 (e.g. merged scan flip flop 102, 106, or 110).

During normal operation of merged scan flip flop 202, a logic "0" is provided to $S_e$ 268 of multiplexer 202 to select $D_{in}$ 250. Accordingly, data provided to $D_{in}$ 250 can be output by multiplexer 258 and provided to DFF 260. After one clock cycle, the data can be stored in DFF 260 and output to Q 262 and $S_{out}$ 264. In one embodiment, Q 262 might be coupled to a combinational logic circuit, whereas $S_{out}$ 264 might be coupled to $S_{in}$ of a subsequent scan flip flop to enable a scan test (also referred to in the art as a "scan chain test") mode of operation.

As shown in FIG. 2, merged scan flip flop 202 can be configured to operate in either a scan test or a standby mode by providing a logic "1" to $S_e$ 268, thereby allowing multiplexer 258 to provide either $S_{in}$ 252 or $R_{in}$ 254 to DFF 260. When a scan test is to be performed, a logic "0" can be provided to $R_e$ 270 to select $S_{in}$ 252. As shown in FIG. 2, $S_{in}$ 252 can be disabled when merged scan flip flop 202 is operating in a standby mode by providing a logic 1 to $R_e$ 270, thereby selecting $R_{in}$ 254.

Thus, merged scan flip flop 202 in FIG. 2 can be advantageously situated in a desired portion of a chain of serially coupled scan flip flops to enable the insertion of data, for example from memory unit 136, directly into the desired portion of the chain. For example, merged scan flip flops 102, 106, and 110 each allow data from memory unit 136 to be inserted directly into a respective group of serially coupled scan flip flops via $R_{in}$ of each merged scan flip flop. In contrast, such insertion of data cannot be achieved using the subsequent scan flip flops in each group, such as scan flip flops 104a, 104b, and 104c.

Figure 3:
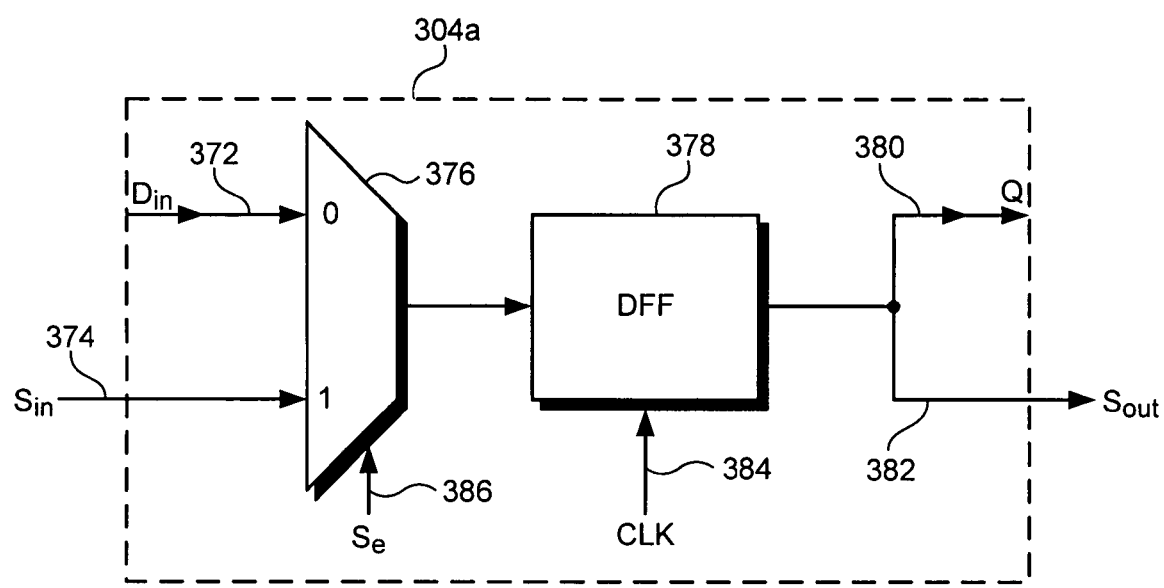
FIG. 3 shows an exemplary implementation of a scan flip flop used in the block diagram of FIG. 1 in accordance with one embodiment of the invention.

FIG. 3 shows an exemplary implementation of a scan flip flop in accordance with one embodiment of the invention. Scan flip flop 304a in FIG. 3 includes two-to-one multiplexer 376 and D flip flop ("DFF") 378. As shown in FIG. 3, scan flip flop 304a includes data input ("$D_{in}$") 372, scan input ("$S_{in}$") 374, scan select input ("$S_e$") 386, clock input ("CLK") 384, data output ("Q") 380, and scan output ("$S_{out}$") 382. In one embodiment, $D_{in}$ 372, $S_{in}$ 374, Q 380, and $S_{out}$ 382 in FIG. 3 correspond respectively to $D_{in}$, $S_{in}$, Q, and $S_{out}$ of each scan flip flop in FIG. 1 (e.g. scan flip flop 104a, 104b, 104c, 108a, 108b, 108c, 112a, 112b, or 112c).

During normal operation of scan flip flop 304a, a logic "0" is provided to $S_e$ 386 of multiplexer 376 to select $D_{in}$ 372. Accordingly, data provided to $D_{in}$ 372 can be output by multiplexer 376 and provided to DFF 378. After one clock cycle, the data can be stored in DFF 378 and output to Q 380 and $S_{out}$ 382. In one embodiment, Q 380 might be coupled to a combinational logic circuit, whereas $S_{out}$ 382 might be coupled to $S_{in}$ of a subsequent scan flip flop to enable a scan test (also referred to in the art as a "scan chain test") mode of operation. Scan flip flop 304a in FIG. 3 can be configured to operate in a scan test mode or a standby mode by providing a logic 1 to $S_e$ 386, thereby selecting $S_{in}$ 374. It should be noted that in the embodiment of FIG. 1, the $S_e$ input (not shown in FIG. 1) of each scan flip flop in system 100 is set to logic 1 such that the $S_{in}$ input of each scan flip flop is selected to enable operation in the standby mode.

Thus, the present invention enables memory unit 136, which can be, for example, an SRAM, to retain M bits of state data of an integrated circuit. Therefore, the present invention advantageously allows an integrated circuit to be powered down during periods when an electronic device is in a standby mode, without losing its current state. As a result, the undesirable power dissipation in the integrated circuit can be advantageously reduced, thereby increasing the performance of the power source of the portable electronic device. Moreover, the present invention can be implemented with greater ease than conventional techniques for retaining the state of an integrated circuit. For example, in contrast to techniques utilizing balloon flip flops, the present invention does not require integration of numerous additional power supply routing lines, and thus consumes substantially less chip area, and is easier to design, layout, and verify, among other advantages. Furthermore, the invention implements the state data save/restore operation with great parallelism, in that only N clock cycles are needed to store M bits of state data in the form of M/N words (where M can be much greater than N).

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a system for retaining state data of an integrated circuit has been described.

The invention claimed is:

1. A system for retaining M bits of state data of an integrated circuit during power down, said system comprising:
    M serially coupled scan flip flops divided into M/N groups, each of said groups containing a merged scan flip flop and a final scan flip flop, said M serially coupled scan flip flops containing said M bits of state data;
    said merged scan flip flop in each of said groups being coupled to a respective read port of a memory unit, and said final scan flip flop of each of said groups being coupled to a respective write port of said memory unit, said system thereby enabling said memory unit to save said M bits of state data in N clock cycles;
    wherein said M serially coupled scan flip flops are powered by a first power supply and wherein said memory unit is powered by a second power supply.

2. The system of claim 1 wherein said system enables said memory unit to restore said M bits of state data to said M serially coupled scan flip flops in N clock cycles.

3. The system of claim 1 wherein said M serially coupled scan flip flops are situated in said integrated circuit.

4. The system of claim 1 wherein each of said M serially coupled scan flip flops includes a scan input and a corresponding scan output.

5. The system of claim 1 wherein said memory unit is a static random access memory ("SRAM") configured to save N M/N bit words.

6. The system of claim 1 wherein said system is controlled by a standby signal.

7. The system of claim 1 wherein said integrated circuit is a CPU situated in a portable electronic device.

8. The system of claim 7 wherein said portable electronic device is selected from the group consisting of a cellular telephone, a personal digital assistant ("PDA"), a laptop computer, and MP3 player, and a digital camera.

9. A state data retaining system for retaining M bits of said state data of an integrated circuit during power down, said state data retaining system comprising:
   M flip flops divided into M/N groups, each of said M/N groups containing a plurality of grouped flip flops, said M flip flops configured to contain said M bits of said state data;
   each of said plurality of grouped flip flops being coupled to a respective read port of a memory unit, said state data retaining system thereby enabling said memory unit to save said M bits of said state data of said integrated circuit in N clock cycles,
   wherein said M flip flops are powered by a first power supply and wherein said memory unit is powered by a second power supply.

10. The state data retaining system of claim 9 wherein said state data retaining system enables said memory unit to restore said M bits of said state data to said M flip flops in N clock cycles upon power up.

11. The state data retaining system of claim 9 wherein said M flip flops are situated in said integrated circuit.

12. The state data retaining system of claim 9 wherein each of said M flip flops includes a scan input and a corresponding scan output.

13. The state data retaining system of claim 9 wherein said memory unit is a static random access memory ("SRAM") configured to save N M/N bit words.

14. The state data retaining system of claim 9 wherein said system is controlled by a standby signal.

15. The state data retaining system of claim 9 wherein said integrated circuit is a CPU situated in a portable electronic device.

16. The state data retaining system of claim 15 wherein said portable electronic device is selected from the group consisting of a cellular telephone, a personal digital assistant ("PDA"), a laptop computer, an MP3 player, and a digital camera.

* * * * *